(12) United States Patent
Kwak

(10) Patent No.: US 8,035,937 B2
(45) Date of Patent: Oct. 11, 2011

(54) ELECTROSTATIC DISCHARGE CIRCUIT

(75) Inventor: Kook-Whee Kwak, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 120 days.

(21) Appl. No.: 12/491,803

(22) Filed: Jun. 25, 2009

(65) Prior Publication Data

US 2009/0323237 A1 Dec. 31, 2009

(30) Foreign Application Priority Data

Jun. 27, 2008 (KR) .................. 10-2008-0061939

(51) Int. Cl.
*H02H 3/22* (2006.01)
(52) U.S. Cl. .......................................... 361/56; 361/111
(58) Field of Classification Search .............. 361/56, 361/111
See application file for complete search history.

(56) References Cited

U.S. PATENT DOCUMENTS

| | | | |
|---|---|---|---|
| 6,433,985 B1 * | 8/2002 | Voldman et al. | 361/113 |
| 7,218,491 B2 * | 5/2007 | Jaussi et al. | 361/56 |
| 7,459,754 B2 | 12/2008 | Kang | |
| 2006/0126236 A1 | 6/2006 | Vice | |
| 2008/0179681 A1 | 7/2008 | Kwak | |
| 2008/0259511 A1 | 10/2008 | Worley | |
| 2009/0021872 A1 | 1/2009 | Ker et al. | |

FOREIGN PATENT DOCUMENTS

| | | |
|---|---|---|
| JP | 2007-234718 | 9/2007 |
| JP | 2008-532308 | 8/2008 |
| JP | 2008-547223 | 12/2008 |
| WO | WO 2006/092756 A1 | 9/2006 |
| WO | WO 2007/001860 A2 | 1/2007 |

OTHER PUBLICATIONS

Notice of Preliminary Rejection issued from Korean Intellectual Property Office on Apr. 21, 2010.

* cited by examiner

*Primary Examiner* — Danny Nguyen
(74) *Attorney, Agent, or Firm* — IP & T Group LLP

(57) ABSTRACT

An electrostatic discharge device has relatively superior characteristics for protecting a gate insulation layer of an input buffer transistor of a semiconductor device from static electricity while minimizing signal delay. The electrostatic discharge circuit includes a main electrostatic discharge section configured to discharge static electricity inputted to an input/output pad to at least one voltage line, an input impedance section configured to adjust an amount of current flowing from the input/output pad depending upon a frequency of an input signal of the input/output pad, an auxiliary electrostatic discharge section connected to the input impedance section and configured to discharge the static electricity inputted to the input/output pad to the at least one voltage line, and an input buffer connected between the auxiliary electrostatic discharge section and an internal circuit.

5 Claims, 2 Drawing Sheets

ELECTROSTATIC DISCHARGE CIRCUIT

CROSS-REFERENCE TO RELATED APPLICATIONS

The present application claims priority of Korean patent application number 10-2008-0061939, filed on Jun. 27, 2008, the disclosure of which is incorporated herein by reference in its entirety.

BACKGROUND OF THE INVENTION

The present invention relates to an electrostatic discharge device of a semiconductor device, and more particularly, to an electrostatic discharge device which is suitable for a semiconductor device operating at a high speed.

In general, electrostatic discharge (ESD) indicates a phenomenon that, when objects insulated from each other come into contact with each other electrically, current momentarily flows due to a considerably large difference in the voltages of the objects.

If a high voltage by ESD current flows to a semiconductor device, an internal circuit of the semiconductor device is likely to be damaged. Therefore, in most semiconductor devices, in order to protect internal circuits, an ESD protection circuit is installed between an input/output pad and the internal circuits.

FIG. 1 illustrates a conventional electrostatic discharge circuit.

Referring to FIG. 1, in order to protect an internal circuit 150 when static electricity is applied to an input/output pad I/O, a main electrostatic discharge section 110, an input resistor 120, an auxiliary electrostatic discharge section 130, and an input buffer 140 are formed between the input/output pad I/O and the internal circuit 150.

The main electrostatic discharge section 110 includes a first main electrostatic discharge unit 112 which is formed between the input/output pad I/O and a power voltage (VCC) line and a second main electrostatic discharge unit 114 which is formed between the input/output pad I/O and a ground voltage (VSS) line. The main electrostatic discharge section 110 is mainly constituted by diode chains and discharges static electricity, which is applied to the input/output pad I/O, to the power voltage (VCC) line or the ground voltage (VSS) line.

The input resistor 120 adjusts an on/off ratio. Similarly to the main electrostatic discharge section 110, the auxiliary electrostatic discharge section 130 discharges static electricity to the power voltage (VCC) line or the ground voltage (VSS) line when the static electricity is applied. The auxiliary electrostatic discharge section 130 functions to prevent the input buffer 140 from being damaged when static electricity is abruptly applied.

The input buffer 140 is composed of a PMOS transistor 142 and an NMOS transistor 144. If excessive voltages are applied to the gates of these transistors 142 and 144, the gate oxide layers of the transistors 142 and 144 are likely to be damaged. In order to prevent this, the auxiliary electrostatic discharge section 130 is used.

The auxiliary electrostatic discharge section 130 includes a PMOS transistor 132 which is formed between the input/output pad I/O and the power voltage (VCC) line and an NMOS transistor 134 which is formed between the input/output pad I/O and the ground voltage (VSS) line.

In the electrostatic discharge circuit, in order for the input resistor 120 to properly perform its function, the input resistor 120 should have resistance over a predetermined level (usually 100Ω). Consequently, in a semiconductor device operating at a high speed over several GHz, RC (resistance-capacitance) delay increases due to the resistance of the input resistor 120 and the capacitance of the back-end transistors 132 and 134. For example, in the case where a semiconductor device operates at a speed over several GHz, the rising time of a signal has the level of approximately 10 ps. In this regard, when assuming that the input resistor 120 has resistance of approximately 100Ω and the auxiliary electrostatic discharge section 130 has capacitance of approximately 0.1 pF, RC signal delay of an approximately 10 ps level occurs, which is intolerable.

If the resistance of the input resistor 120 is decreased so as to reduce the RC signal delay, when static electricity is produced, the probability of the transistors 132 and 134 of the auxiliary electrostatic discharge section 130 or the transistors 142 and 144 of the input buffer 140 to be damaged increases. That is to say, in the case where the resistance of the input resistor 120 is decreased, since the amount of current flowing through the transistors 132 and 134 of the auxiliary electrostatic discharge section 130 is increased, the transistors 132 and 134 are likely to be damaged unless the size of the transistors 132 and 134 is sufficiently large. Also, as the amount of current discharged through the transistors 132 and 134 increase, a voltage drop occurring due to the current and its path resistance increase. Accordingly, the gate insulation layers of the transistors 142 and 144 of the input buffer 140 are likely to be damaged.

In order to cope with these problems, the sizes of the transistors 132 and 134 of the auxiliary electrostatic discharge section 130 should be increased to a sufficient level. However, in this case, as an increased area of a chip is used, it is difficult to accommodate the trend toward the high integration of a semiconductor device.

Thus, in order to appropriately conform to the high speed operation of a semiconductor device, an electrostatic discharge circuit having relatively superior characteristics for protecting the gate insulation layers of the transistors of the input buffer and capable of minimizing signal delay is desired.

SUMMARY OF THE INVENTION

An embodiment of the present invention is directed to providing an electrostatic discharge device which has relatively superior characteristics for protecting a gate insulation layer of an input buffer transistor of a semiconductor device from static electricity while minimizing signal delay.

In accordance with an aspect of the present invention, there is provided an electrostatic discharge circuit, which includes: a main electrostatic discharge section configured to discharge static electricity inputted to an input/output pad to at least one voltage line; an input impedance section configured to adjust an amount of current flowing from the input/output pad depending upon a frequency of an input signal of the input/output pad; an auxiliary electrostatic discharge section connected to the input impedance section and configured to discharge the static electricity inputted to the input/output pad to the at least one voltage line; and an input buffer connected between the auxiliary electrostatic discharge section and an internal circuit.

The input impedance section may include at least one capacitor. The input impedance section may include a first input impedance circuit which includes at least one resistor element and a second input impedance circuit which is connected in parallel to the first input impedance circuit and includes at least one capacitor. The second input impedance circuit may include only a capacitor element.

The main electrostatic discharge section may include a first main electrostatic discharge unit which is connected between the input/output pad and a power voltage line of the at least one voltage line and a second main electrostatic discharge unit which is connected between the input/output pad and a ground voltage line of the at least one voltage line.

The auxiliary electrostatic discharge section may include a first auxiliary electrostatic discharge unit which is connected between the input impedance section and the power voltage line and a second auxiliary electrostatic discharge unit which is connected between the input impedance section and the ground voltage line. The first auxiliary electrostatic discharge unit may include a PMOS transistor having a drain which is connected to a gate of a PMOS transistor of the input buffer and a source which is connected to a source of the PMOS transistor of the input buffer.

The second auxiliary electrostatic discharge unit may include an NMOS transistor having a drain which is connected to a gate of an NMOS transistor of the input buffer and a source which is connected to a source of the NMOS transistor of the input buffer.

In accordance with another aspect of the present invention, there is provided an electrostatic discharge circuit, which includes: an electrostatic discharge section configured to discharge static electricity introduced from an outside to a voltage line; and an input impedance section connected to any one of an input and an output of the electrostatic discharge section and configured to adjust an amount of current passing therethrough depending upon a frequency of a signal coupled to the electrostatic discharge section.

The input impedance section may include at least one capacitor. The input impedance section may include a first input impedance circuit which includes at least one resistor element and a second input impedance circuit which is connected in parallel to the first input impedance circuit and includes at least one capacitor element.

DESCRIPTION OF SPECIFIC EMBODIMENT

Other objects and advantages of the present invention can be understood by the following description, and become apparent with reference to an embodiment of the present invention.

Figure 1:
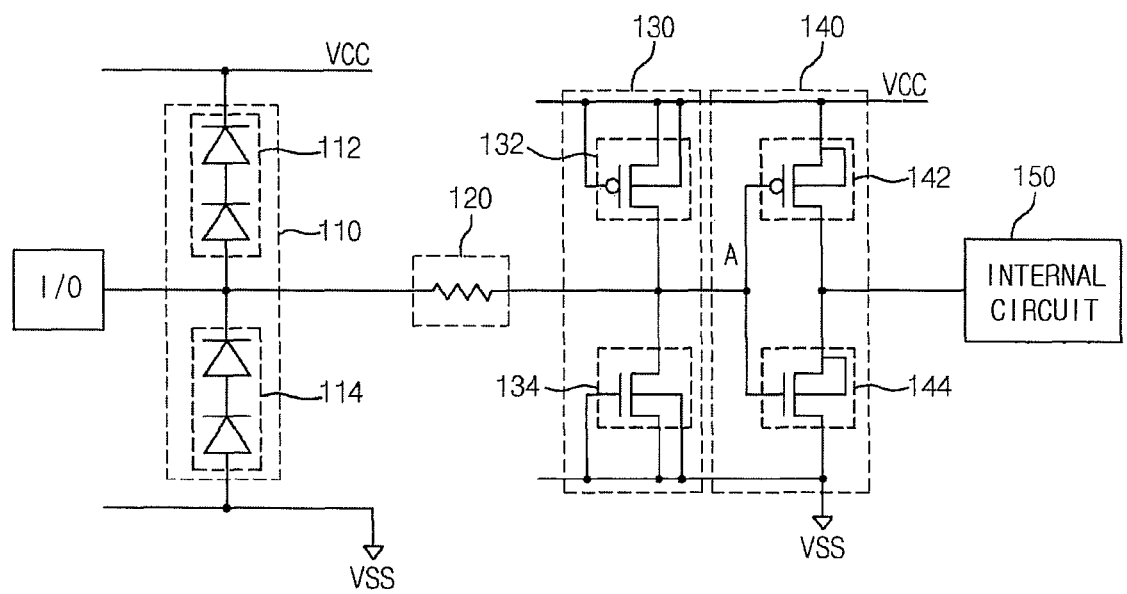
FIG. 1 illustrates a conventional electrostatic discharge circuit.
Figure 2:
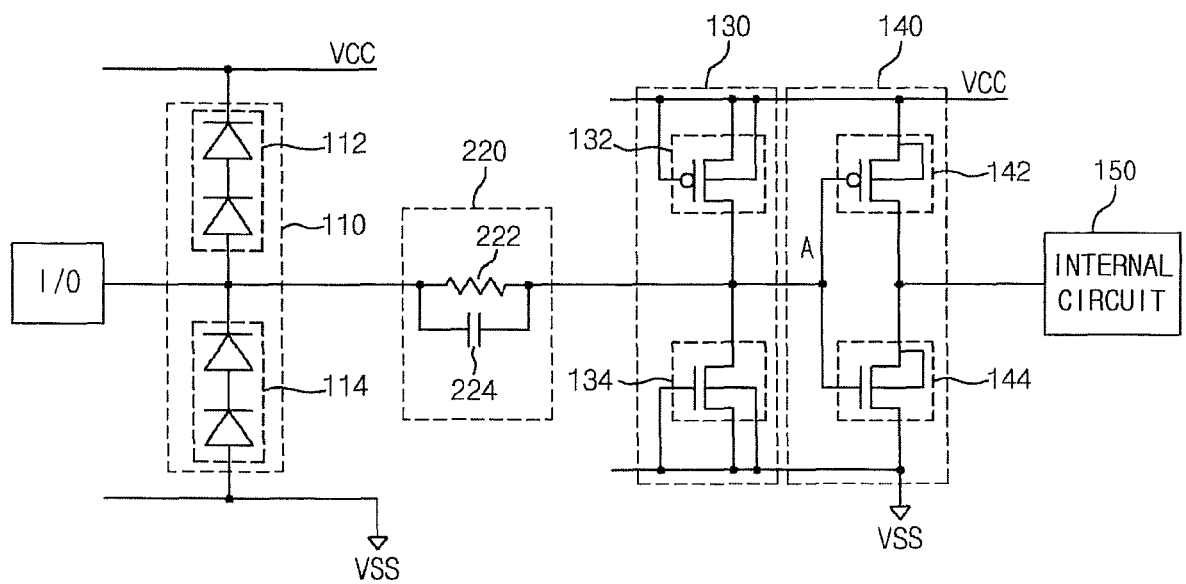
FIG. 2 illustrates an electrostatic discharge circuit in accordance with an embodiment of the present invention.

FIG. 2 illustrates an electrostatic discharge circuit in accordance with an embodiment of the present invention.

Referring to FIG. 2, an electrostatic discharge circuit in accordance with an embodiment of the present invention is formed between an input/output pad I/O and an internal circuit 150 and protects the internal circuit 150 from the static electricity applied to the input/output pad I/O, a power voltage (VCC) line or a ground voltage (VSS) line.

The electrostatic discharge circuit according to the present invention comprises a main electrostatic discharge section 110 which discharges the static electricity inputted to the input/output pad I/O to the power voltage (VCC) line or the ground voltage (VSS) line, an input impedance section 220 which is connected to the input/output pad I/O and adjusts the amount of current depending upon the frequency of an input signal, an auxiliary electrostatic discharge section 130 which is connected to the input impedance section 220 and discharges static electricity to the power voltage (VCC) line or the ground voltage (VSS) line when static electricity is inputted to the input/output pad I/O, and an input buffer 140 which is connected between the auxiliary electrostatic discharge section 130 and the internal circuit 150.

The main electrostatic discharge section 110 includes a first main electrostatic discharge unit 112 which is formed between the input/output pad I/O and the power voltage (VCC) line and a second main electrostatic discharge unit 114 which is formed between the input/output pad I/O and the ground voltage (VSS) line. The main electrostatic discharge section 110 is mainly constituted by diode chains and discharges static electricity to the power voltage (VCC) line or the ground voltage (VSS) line when the static electricity is applied to the input/output pad I/O. When a circuit operates normally, the main electrostatic discharge section 110 is in an off state. If static electricity is generated between the input/output pad I/O and the power voltage (VCC) line or the ground voltage (VSS) line, the main electrostatic discharge section 110 is turned on and provides a main path for discharging most of the static electricity.

The input impedance section 220 is formed between the main electrostatic discharge section 110 and the auxiliary electrostatic discharge section 130 and adjusts the amount of current in response to a signal inputted to the input/output pad I/O. That is to say, the input impedance section 220 starts to operate before the voltage applied to the gate insulation layer of transistors 142 and 144 of the input buffer 140 reaches the breakdown voltage of the gate insulation layer, and prevents the gate insulation layer from being damaged. Also, the input impedance section 220 reduces the current discharged through transistors 132 and 134 of the auxiliary electrostatic discharge section 130 and simultaneously decreases the voltage applied to the gate insulation layers of the transistors 142 and 144 so that the transistors 132, 134, 142 and 144 are protected.

Preferably, the input impedance section 220 is configured in a manner such that a resistor 222 and a capacitor 224 are connected in parallel.

The auxiliary electrostatic discharge section 130 includes a first auxiliary electrostatic discharge unit 132 which is formed between the input impedance section 220 and the power voltage (VCC) line and a second auxiliary electrostatic discharge unit 134 which is formed between the input impedance section 220 and the ground voltage (VSS) line. It is preferred that the first auxiliary electrostatic discharge unit 132 comprises a PMOS transistor and the second auxiliary electrostatic discharge unit 134 comprise an NMOS transistor.

In the event that static electricity is generated between the input/output pad I/O and the power voltage (VCC) line or the ground voltage (VSS) line, most of the static electricity is discharged through the main electrostatic discharge section 110 to the VCC line or the VSS line, and a remaining portion of the static electricity is discharged through the auxiliary electrostatic discharge section 130 to the VCC line or the VSS line. The auxiliary electrostatic discharge section 130 operates before the voltage applied to the gate insulation layer of the input buffer 140 reaches the breakdown voltage of the gate insulation layer, and prevents the gate insulation layer of the input buffer 140 from being damaged.

The PMOS transistor 132 has a drain which is connected to the gate of the PMOS transistor 142 of the input buffer 140 and a source which is connected to the source of the PMOS transistor 142. The NMOS transistor 134 has a drain which is connected to the gate of the NMOS transistor 144 of the input buffer 140 and a source which is connected to the source of the NMOS transistor 144.

Due to the fact that the capacitor 224 is connected in parallel to the resistor 222 in the input impedance section 220, it is possible to prevent the gate insulation layer of the input buffer 140 from being damaged and RC delay from occurring even at a high frequency.

Since the impedance of a capacitor is inversely proportional to a frequency, if there is a difference between the characteristic frequency of an electrostatic voltage and the frequency of an input signal under the normal operation of a circuit, it makes the impedance of the capacitor different in each case.

In general, the rising time of an electrostatic voltage is over approximately 1 ns, whereas the rising time of an input signal operating at several GHz is an approximately 10 ps level. The rising time of a signal decreases as an operation frequency increases. In each case, when calculating impedance by a 1 pF capacitor using a symbolic expression ($T/(2\pi C)$ where T is period and C is capacitance) for calculating the impedance of a capacitor, the impedance of the capacitor is approximately 200Ω in the case of electrostatic discharge and approximately 2Ω in the case of a normal operation signal. As an operation frequency increases, the impedance by the capacitor decreases.

Therefore, when the input resistor having resistance of 200Ω is used, the impedance of the input impedance section 220 becomes approximately 100Ω in the case of electrostatic discharge so that the transistors of the input buffer 140 can be sufficiently protected, and the input impedance of the normal operation signal is no greater than several Ω so that signal delay can be minimized.

That is to say, in the present invention, due to the fact that the capacitor is connected in parallel to the resistor in the input impedance section, signal delay by RC delay can be minimized in normal operation where a high frequency of signal is inputted, and it is possible to prevent the gate insulation layer of the transistors of an input end from being damaged even when static electricity is generated.

Here, considering the fact that the static electricity has the characteristics of alternate current at initial rising time, the electrostatic discharge circuit according to the present invention can mainly perform an electrostatic discharge function in correspondence to the initial rising time during which static electricity has the characteristics of alternate current.

Figure 3:
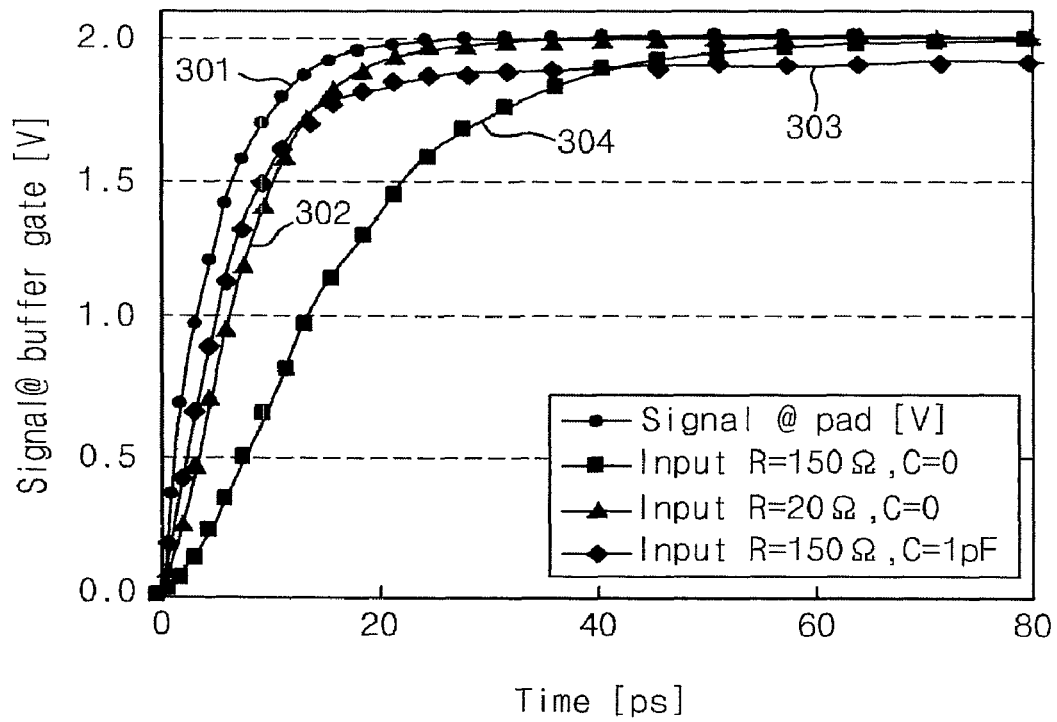
FIG. 3 is a graph showing simulation results obtained by comparing the signal delay characteristics of electrostatic discharge circuits according to the conventional art and the present invention.

FIG. 3 is a graph showing simulation results obtained by comparing the signal delay in electrostatic discharge circuits according to the conventional art and the present invention.

FIG. 3 illustrates a voltage transmitted to a node A at the front end of the input buffer 140 when a 2V signal voltage having a rising time of an approximately 10 ps level is applied to the input/output pad I/O. In a simulation circuit, the PMOS transistor 132 was excluded, the NMOS transistor 134 having the size of approximately 15/0.14 μm was used, and the gate capacitance of the input buffer 140 transistor was set to approximately 50 pF.

Referring to FIG. 3, a signal 304 with input resistance of 150Ω according to the conventional circuit reveals signal delay of approximately 20 ps at 90% (1.8V) of a saturation voltage, as compared to a pad signal 301, which is intolerable. It can be seen that signal delay decreases to a several ps level in a signal 302 with input resistance decreased to 20Ω according to the conventional art and in a signal 303 of the circuit (R=150Ω and C=1 pF) according to the present invention.

However, in the case where the input resistance is decreased to 20Ω without using a capacitor, although signal delay can be decreased, the characteristics for protecting the gate insulation layer of the input buffer markedly deteriorate. This can be observed from FIG. 4.

Figure 4:
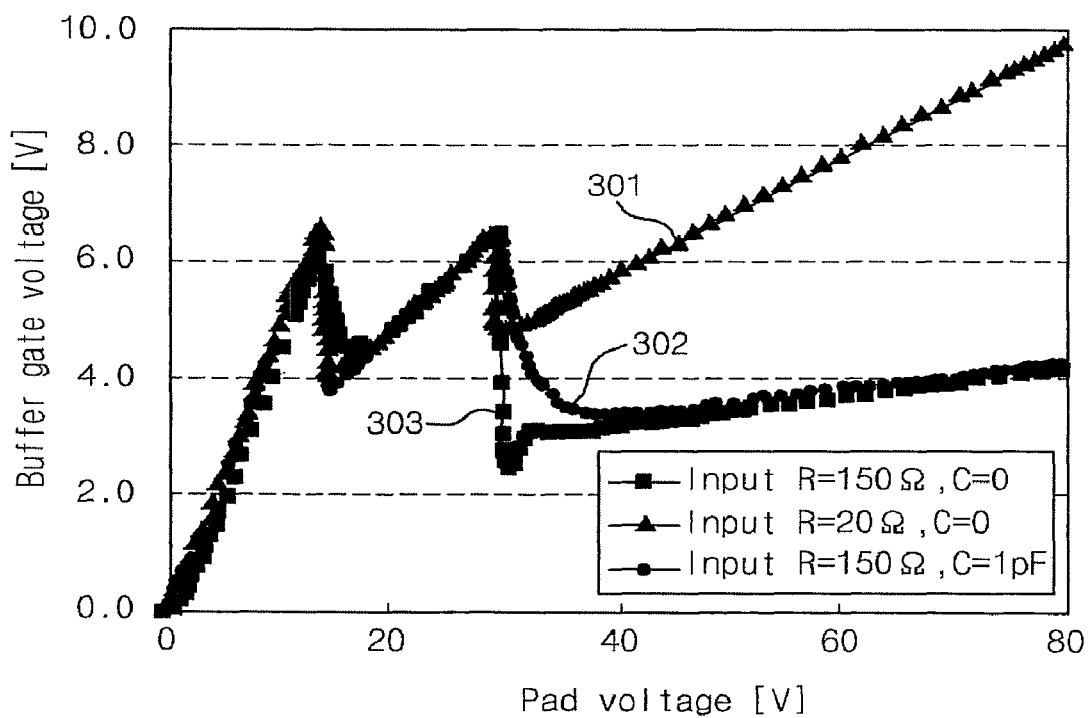
FIG. 4 is a graph showing simulation results obtained by comparing the gate protection characteristics of electrostatic discharge circuits according to the conventional art and the present invention.

FIG. 4 is a graph showing simulation results obtained by comparing the buffer gate protection characteristics of electrostatic discharge circuits according to the conventional art and the present invention.

FIG. 4 illustrates a voltage applied to the node A at the front end of the input buffer 140 when a VSS pad is set to a ground and an electrostatic voltage having a rising time of an approximately 1 ns level is applied to the input/output pad I/O. Since the voltage of the node A corresponds to the voltage applied to both ends of the gate insulation layer of the buffer NMOS transistor 144, if the voltage exceeds the breakdown voltage of the gate insulation layer, the insulation layer is damaged. In the cases of a conventional circuit only having input resistance of 150Ω and the circuit (R=150Ω and C=1 pF) according to the present invention, even when the electrostatic voltage of the input/output pad I/O increases up to 40V, the voltage at the gate insulation layer is maintained below approximately 6.5V (303 and 302). However, in the case of a conventional circuit in which input resistance is decreased to 20Ω, it can be seen that the voltage at the gate insulation layer increases to the level of approximately 10V in proportion to the electrostatic voltage of the input/output pad I/O. For example, if the breakdown voltage of the gate insulation layer of the transistor 144 of the input buffer is the level of approximately 7V, the gate insulation layer of the transistor of the input buffer is protected in the electrostatic discharge circuit according to the present invention and in the conventional circuit having the input resistance of 150Ω, whereas the gate insulation layer of the buffer transistor in the conventional circuit having input resistance decreased to 20Ω is damaged.

As can be readily seen from the above simulation results, in the conventional art, if input resistance is decreased, while signal delay can be prevented, a phenomenon occurs in which the gate insulation layer of the transistor of the input buffer is damaged. If the input resistance is increased so as to solve this problem, excessive signal delay due to an RC delay occurs. In the present invention, by additionally providing a capacitor, the signal delay and the breakdown of the gate insulation layer can be simultaneously prevented.

As is apparent from the above description, the electrostatic discharge circuit according to the present invention provides advantages in that relatively superior characteristics for protecting the gate insulation layers of the transistors of an input buffer from static electricity in a semiconductor device can be obtained and signal delay can be minimized.

Accordingly, in the present invention, it is possible to provide an electrostatic discharge circuit having no RC signal delay even in a semiconductor device operating at a high speed of several GHz.

While the present invention has been described with respect to the specific embodiment, it will be apparent to those skilled in the art that various changes and modifications may be made without departing from the spirit and scope of the invention as defined in the following claims.

What is claimed is:

1. An electrostatic discharge circuit, comprising:
a main electrostatic discharge section configured to discharge static electricity inputted to an input/output pad to at least one voltage line;
an input impedance section configured to adjust an amount of current flowing from the input/output pad depending upon a frequency of an input signal of the input/output pad;
an auxiliary electrostatic discharge section connected to the input impedance section and configured to discharge the static electricity inputted to the input/output pad to the at least one voltage line; and
an input buffer connected between the auxiliary electrostatic discharge section and an internal circuit,
wherein the input impedance section includes a resistor element and a capacitor element which are connected in parallel between the input/output pad and the auxiliary electrostatic discharge section and are each connected directly to each of the input/output pad and the auxiliary electrostatic discharge section.

2. The circuit of claim 1, wherein the main electrostatic discharge section includes a first main electrostatic discharge unit which is connected between the input/output pad and a power voltage line of the at least one voltage line and a second main electrostatic discharge unit which is connected between the input/output pad and a ground voltage line of the at least one voltage line.

3. The circuit of claim 1, wherein the auxiliary electrostatic discharge section includes a first auxiliary electrostatic discharge unit which is connected between the input impedance section and a power voltage line of the at least one voltage line and a second auxiliary electrostatic discharge unit which is connected between the input impedance section and a ground voltage line of the at least one voltage line.

4. The circuit of claim 3, wherein the first auxiliary electrostatic discharge unit includes a PMOS transistor having a drain which is connected to a gate of a PMOS transistor of the input buffer and a source which is connected to a source of the PMOS transistor of the input buffer.

5. The circuit of claim 3, wherein the second auxiliary electrostatic discharge unit comprises an NMOS transistor having a drain which is connected to a gate of an NMOS transistor of the input buffer and a source which is connected to a source of the NMOS transistor of the input buffer.

* * * * *